United States Patent
Endrōs

[11] Patent Number: 6,143,976
[45] Date of Patent: Nov. 7, 2000

[54] SOLAR CELL WITH REDUCED SHADING AND METHOD OF PRODUCING THE SAME

[75] Inventor: Arthur Endrōs, Munich, Germany

[73] Assignee: Siemens Solar GmbH, Munich, Germany

[21] Appl. No.: 09/319,397

[22] PCT Filed: Nov. 19, 1997

[86] PCT No.: PCT/EP97/06465

§ 371 Date: Jul. 19, 1999

§ 102(e) Date: Jul. 19, 1999

[87] PCT Pub. No.: WO98/25312

PCT Pub. Date: Jun. 11, 1998

[30] Foreign Application Priority Data

Dec. 3, 1996 [DE] Germany ............... 196 50 111

[51] Int. Cl.[7] ............... H01L 31/00
[52] U.S. Cl. ............... 136/256
[58] Field of Search ............... 136/256

[56] References Cited

U.S. PATENT DOCUMENTS 5,067,985  11/1991  Carver et al. ............... 136/255
5,468,652  11/1995  Gee ............... 136/256

OTHER PUBLICATIONS

Martinelli, G., et al.: "Growth of Stable Dislocation–Free 3–Grain Silicon Ingots for Thinner Slicing", Applied Physics Letters, vol. 62, No. 25, Jun. 21, 1993, pp. 3262–3263.

Gee, J.M. et al.: "Emitter Wrap–Through Solar Cell", Proceedings of the Photovoltaic Specialists, Louisville, May 10–14, 1993, No. Conf. 23, May 10, 1993, IEEE, pp. 265–270.

Primary Examiner—Mark Chapman
Attorney, Agent, or Firm—Wolf, Greenfield & Sacks, P.C.

[57] ABSTRACT

A solar cell is disclosed having electrical connections only on the rear side to reduce shading and improve efficiency of the cell. The solar cell includes a crystalline silicon substrate exhibiting crystallographic planes on the front and rear sides and a flat, doped emitter layer on at least the front side. The solar cell also includes a plurality of elongated slots aligned parallel to crystallographic planes and extending through the entire thickness of the silicon substrate of the solar cell. A high doping, corresponding to the conductivity type of the emitter is located in the slots. Two contact patterns are located on the rear side of the solar cell. The first is for electrical connection to the bulk material and the second is for electrical connection to the emitter and at least partly overlaps the slots. The slots are crystallographically etched anisotropically from the rear side and taper toward the front side of the cell. Also disclosed is a method for producing a solar cell. In this method, a plurality of slots are etched into, and extending through the entire thickness of, a crystalline silicon substrate in an alkaline, crystal-oriented and masked manner. A flat emitter layer is produced by diffusion of a dopant. Finally a first and second contact pattern are produced on the rear side of the solar cell by imprinting and burning in a conductive path. The second contact pattern is formed to overlap the slots.

12 Claims, 4 Drawing Sheets

SOLAR CELL WITH REDUCED SHADING AND METHOD OF PRODUCING THE SAME

Reduced shading can, for example, be achieved in a solar cell in which both the n and the p contacts are located on the rear side. In this way the front side is not shaded by any contact and is therefore available without restriction for the irradiation of light.

A solar cell without front-side metallization is known, for example, from R. A. Sinton, P. J. Verlinden, R. A. Crane, R. M. Swanson, C. Tilford, J. Perkins and K. Garrison, "Large-Area 21% Efficient Si Solar Cells", Proc. of the 23rd IEEE Photovoltaic Specialists Conference, Louisville, 1993, pages 157 to 161. To produce same, varyingly doped areas are generated side by side in a plurality of masking steps and are metallized or contacted by applying a multilayer metal structure on top thereof. The metal structures are applied by thin-film techniques.

One drawback is that the method needs a plurality of masking steps and is complex as a result. All the charge carriers also have to reach the rear side of the solar cell by way of diffusion, there being a greater probability of charge carrier recombination which in turn reduces the solar cell's collection efficiency.

Another idea for a solar cell without front-side metallization is known from the article entitled "Emitter Wrap-Through Solar Cell" by James M. Gee et al. in a paper for the 23rd Photovoltaic Specialists Conference 1993, Louisville, pages 265 to 270. The solar cell described there comprises an emitter layer placed close to the front side with a pn junction adjacent thereto. Contact holes drilled and metallized by means of a laser connect the emitter layer to metallized contacts positioned on the rear side. The rear-side contacts are also disposed on the rear side interdigital to the "front-side contacts". This solar cell suffers from the disadvantage of a high number of contact holes that have to be drilled with a laser, this large number requiring about 10,000 contact holes per solar cell for a typical solar cell 100 cm$^2$ in size and a typical gap of 1 mm between the contact holes. This reduces the throughput in automated production. Furthermore, the contact holes and the associated contacts disposed on the rear side have to be adjusted in relation to one another. Undesired structural transformations in the silicon may also be produced in the contact holes drilled with a laser, thereby making it possible to create additional recombination centers for pairs of charge carriers which further reduce collection efficiency. The reduced mechanical strength may lead to rupture in these solar cells.

The present invention's object is to design a solar cell without front-side contacts which create shade; such a solar cell is simple and inexpensive to produce and satisfies other requirements for a high-output solar cell.

In accordance with the invention, this object is solved by a solar cell according to claim 1. Preferred embodiments of the invention and a method of producing same can be gathered from further claims.

The solar cell according to the invention is built up from a (110)-orientation crystalline silicon substrate. This material enjoys the advantage that it exhibits (111) planes aligned vertical to the (110) surface. Anisotropic etching oriented toward the crystal structure makes it possible to generate depressions, holes or openings with a high aspect ratio and two vertical side walls in the (110) substrate. The solar cell according to the invention has a plurality of elongated slots aligned parallel to (111) planes and extending through the entire thickness of the silicon substrate or breaking through this substrate. The inner surfaces of the slots have a high doping corresponding to the conductivity type of the flat emitter layer generated at least on the front side. A grid-like first contact pattern is located on the rear side of the solar cell for electrically connecting the bulk material. Interdigital thereto, a second grid-like contact pattern which overlaps with the slots at least in part and thus ensures the emitter layer's electrical connection is disposed on the rear side.

The front side of the solar cell according to the invention is unimpaired except for the slots and has a high-grade surface which enables good passivation and an effective antireflection layer. Because of the good anisotropic etchability in (110)-oriented silicon, the slots can be generated with high aspect ratios of e.g. 1:600 in the silicon substrate. This makes it possible to minimize the size of the slots and hence the surface losses. Slots that have been anisotropically etched in (110) silicon have side walls which consist of (111) planes. Two of these planes are disposed vertical to the substrate surface, whereas the two "narrow sides" extend at an angle through the substrate. When etching from the rear side of the silicon substrate, the cross section of the slots therefore tapers toward the front side, so that as a result, the surface losses are further reduced by the slots on the front side. The elongated extension of the slots makes it easier to adjust the second contact pattern which overlaps the slots on the rear side.

The silicon substrate is highly doped in the slots. This creates current paths of electrically sufficient conductivity which connect the front side of the solar cell to the rear side, or to the contact pattern applied there. A sufficiently dense pattern of slots and the relatively low substrate thickness cause the current paths to remain short for charge carriers collected on the front side. In this way, the solar cell's series resistance is also low and a high fill factor is made possible.

In an advantageous embodiment of the invention, a so-called tricrystal wafer is used as a substrate, as is known for example from an article by G. Martinelli in Solid State Phenomena Vol. 32 to 33, 1993, pp. 21–26. Such a wafer comprises three monocrystalline regions that are tilted toward one another and which in themselves are each (110)-oriented. The boundary areas between the monocrystalline regions extend radially toward the middle of the wafer so that the monocrystalline regions form sectors of the tricrystal wafer. Two of the three boundary areas are first-order twin grain boundaries on (111) planes which are particularly low in imperfections.

A solar cell according to the invention produced from such a tricrystal wafer enjoys the advantage that the mechanical stability of the wafer and hence of the solar cell is substantially increased compared to a monocrystalline substrate. In this way the substrate thickness can be reduced to values of 30 to 70 $\mu$m without having to take an increased risk of rupture into consideration during processing. The tricrystal wafer is particularly suitable for the invention because it only has (110)-oriented surfaces or makes (110)-oriented silicon substrates sufficiently available for the first time. Crystal pulling of monocrystalline (110)-oriented rods is much more difficult than that of conventional (100) silicon rods, since crystal rearrangements and structural loss are produced more quickly, such loss causing the pulling process to be stopped too early. Crystal pulling of a tricrystal, on the other hand, is 2 to 3 times faster than is the case with (110)-oriented silicon rods. A cone is not necessary at the end of the rod. It can therefore be performed quasi-continuously and without rearrangement. A crucible can be used up to ten times.

A solar cell having a thinner silicon substrate enjoys other technical advantages in addition to the saving in material. Using a thinner substrate, the demand placed on a high-output solar cell that the diffusion length of the minority charge carriers should be greater than the three-fold thickness of the substrate is already satisfied by a material of a lower electronic quality. A thinner silicon substrate in a solar cell therefore results in lower recombination losses than a thicker substrate.

A solar cell with a tricrystalline silicon substrate is sufficiently stable even when there is a plurality of slots breaking through the substrate. It is nevertheless advantageous for the slots extending parallel to (111) planes to be offset against one another so that several slots which might assist a rupture of the substrate parallel to the crystal planes as a result of the predetermined "perforation" are not arranged in succession into one and the same (111) plane.

A first and a second contact pattern on the rear side of the solar cell are preferably applied as thick-film contacts and particularly as conductive pastes to be sinter-fused. The first and second contact patterns form an interdigital structure in which finger-like contacts are alternately arranged, the finger-like contacts of the first and second contact patterns engaging with one another like the teeth of a zip fastener. Each contact pattern comprises at least one bus structure which connects all the finger-like contacts together. One of the bus structures is preferably arranged circumferentially close to the edge of the solar cell's rear side. The surface-area proportions of the first and second contact patterns are preferably approximately equal because identical charge quantities have to be transported for both charge carrier types, thus minimizing the series resistance.

The method of producing the solar cell according to the invention will now be explained in more detail on the basis of exemplary embodiments and the associated ten figures. The figures belong solely to the exemplary embodiments and should not be regarded as restrictive.

FIGS. 1 to 7 use diagrammatic cross sections through the structure to show different procedural stages in the production of the solar cell;

FIGS. 8 and 9 use diagrammatic cross sections through the substrate to show different procedural stages of a process version;

Figure 1:
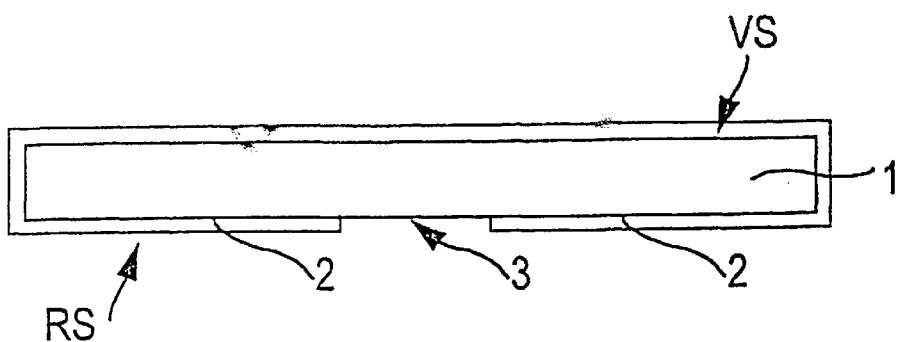

The starting point for the process according to the invention is an e.g. p-doped (110)-orientation silicon wafer 1. The slots or a pattern of slots are produced in the first step. For this purpose, an oxide or nitride layer 2 is first applied all over the entire surface area of the front side VS and the rear side RS. Rectangular openings 3 that correspond to the slot pattern are then photolithographically defined and freely etched in this oxide or nitride layer 2. FIG. 1 illustrates this procedural step on the basis of a diagrammatic cross section through a silicon substrate; this cross section is not true to scale.

Figure 2:
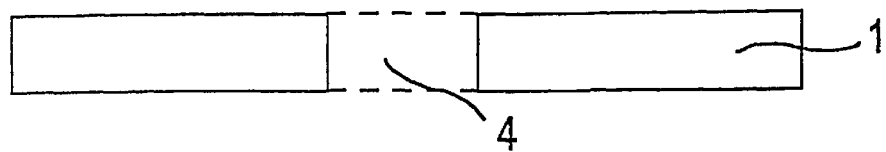

In accordance with the pattern of openings 3 defined in the masking layer 2, slots 4 are now produced in the substrate 1 by means of crystal-oriented alkaline etching. FIG. 2 illustrates this state after removal of the masking layer 2.

Figure 3:
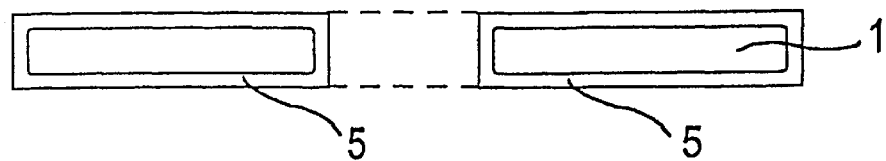

FIG. 3: a flat, n$^+$-doped emitter layer 5, e.g. at a depth of 0.3 to 2 $\mu$m, is produced on all the surfaces of the silicon substrate 1, including the slots, as a result of the phosphorus doping that takes place all over.

Figure 4:
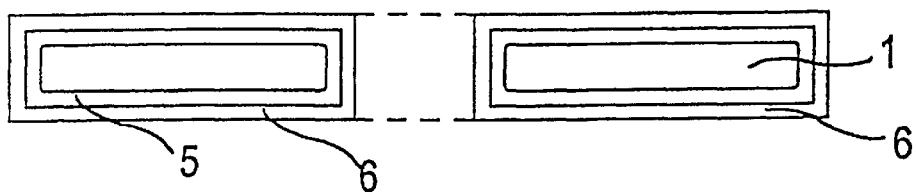

FIG. 4: a passivation layer 6, e.g. an oxide or nitride layer which is usually 70 nm thick, is applied all over each surface in the next step.

Figure 5:
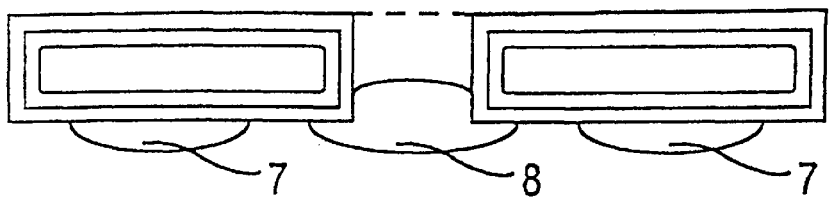

FIG. 5: the electrical contacts are applied to the rear side in a thick-film technique in the next step. As regards the first contact pattern 7, finger-like contacts, in addition to the slots 4, are for example applied to the rear side RS in order to contact the bulk material, i.e. to contact the inner p-doped substrate region. This may be brought about for example by imprinting a conductive screen-printing paste that contains silver or aluminum particles and which can be sintered. The paste contains either aluminum or another dopant that generates p doping, such as boron. A second contact pattern 8 is applied over the slots 4 at least in part, e.g. by imprinting a silver-containing conductive paste. The first and second contact patterns 7 and 8 are grid-shaped and each comprise at least one bus structure and finger-like contacts emanating therefrom. The two contact patterns are arranged on the rear side of the substrate such that the finger-like contacts interdigitally engage with one another and are spatially separate from one another. FIG. 5 shows the configuration after this procedural step.

Figure 6:
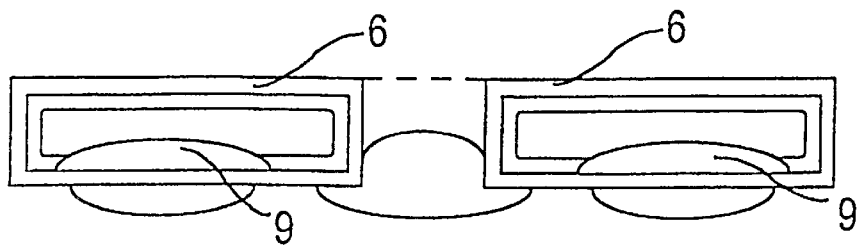

FIG. 6: in the next step, the contacts are burned in and sintered, the passivation layer 6 beneath the contact patterns 7 and 8 being alloyed in an electrically conducting manner. The dopant contained in the paste for the first contact pattern 7 generates a p$^+$ doping 9 which overcompensates the emitter layer 5 and produces the ohmic contact with the internally positioned p-doped region of the substrate 1. The material of the second contact pattern 8 produces a conductive connection to the n$^+$-doped region 5, the emitter layer.

Figure 7:
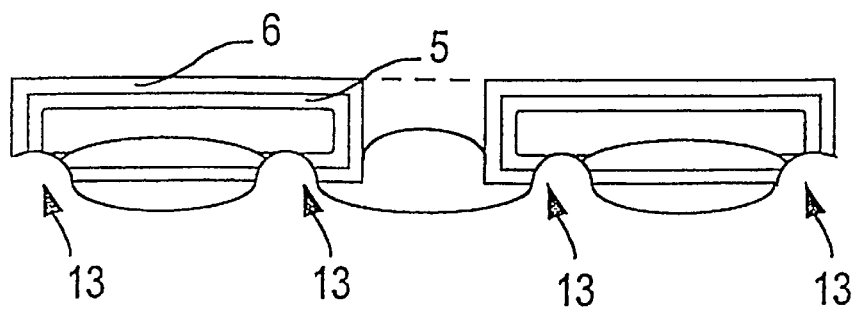

FIG. 7: in the next step, the first and second contact patterns 7 and 8 can be used as a self-adjusting mask to optionally separate the pn junction between the first and second contact patterns, e.g. by plasma etching, depressions 13 being produced between the first and second contact patterns. If the p+ doping 9, which simultaneously represents a back surface field (BSF), prevents a conductive connection between the contact pattern 7 and the emitter layer, plasma etching is not, however, necessary.

Figure 8:
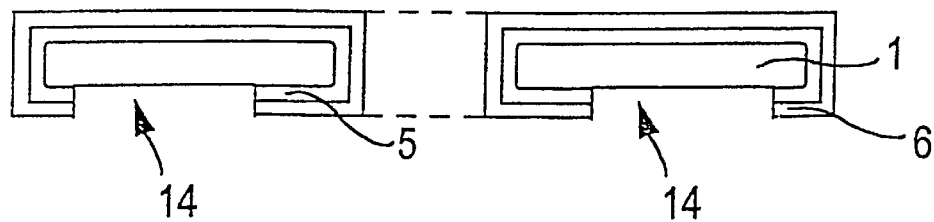

FIG. 8: in one version of the process (following on from the procedural step according to FIG. 4), the passivation layer 6 and emitter layer 5 are removed in a lift-off technique, e.g. by brief plasma etching, in a region 14 which is provided to receive the first contact pattern. This region is therefore somewhat larger in dimension than the first contact pattern.

Figure 9:
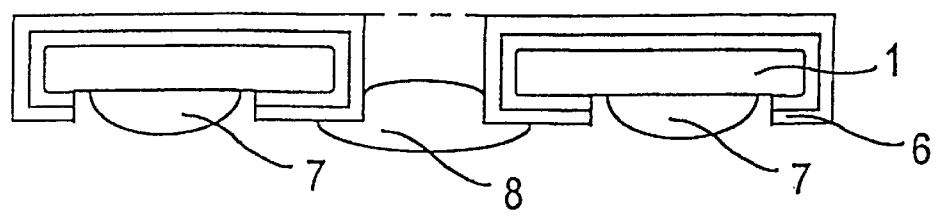

FIG. 9: the first and second contact patterns 7, 8 are then applied e.g. by means of imprinting and are optionally burned in. The first contact pattern may in turn contain a doping suitable for generation of a BSF.

Following on from the state illustrated in FIG. 4, however, it is also possible to first apply the second contact pattern 8 and to use it as a mask for the lift-off technique in order to remove the passivation layer 6 and emitter layer 5, whereby recesses that correspond to the regions 14 and reach right into the bulk material are produced. The first contact pattern 7 is then applied in these recesses. In this version, it is advantageous for the second contact pattern 8 to be generated with a larger surface area than the first contact pattern 7 in order to keep a maximum emitter surface after the lift-off process.

In any case, the first and second contact patterns 7 and 8 are applied such that the two do not overlap and are electrically separate from one another.

Figure 10:
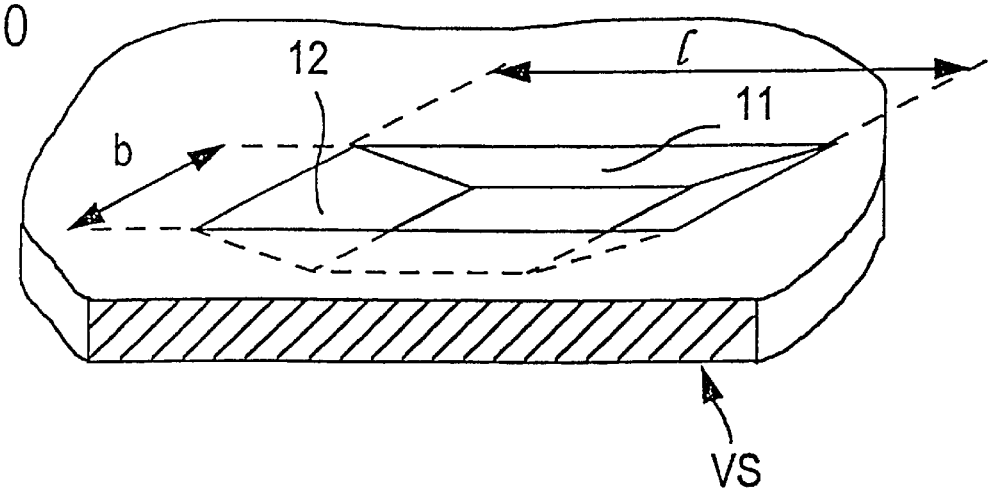
FIG. 10 shows a slot in a perspective horizontal projection of a silicon substrate.

FIG. 10 depicts in a perspective illustration the rear side of the silicon substrate 1 with one of the slots 4. This slot comprises two opposite vertical walls 11 which correspond to (111) planes in the substrate. The narrow sides of the slots 4, on the other hand, are delimited by crystal faces 12 extending at an angle thereto and which also represent (111) planes. When defining the slot pattern in the masking layer 2 at the start of the process, it is borne in mind that the longitudinal axis of the slots is disposed parallel to the vertical (111) planes. Length 1 and width b of the slots (on the rear side) are chosen such that an opening which breaks through the substrate 1 is just produced during crystal-oriented etching. The slot width b is set to 5 to 50 $\mu$m and varies for example from 15 to 20 $\mu$m. The slot length l depends on the thickness of the silicon substrate 1. The length l is preferably chosen such that the virtual intersection of the faces 12 which delimit the narrow sides of the slot is disposed just above the front side VS of the silicon substrate 1. This produces a slot which is examined from the front side VS of the substrate 1 and whose "length" corresponds to b and whose "width" is minimized parallel to the slot length l.

Figure 11:
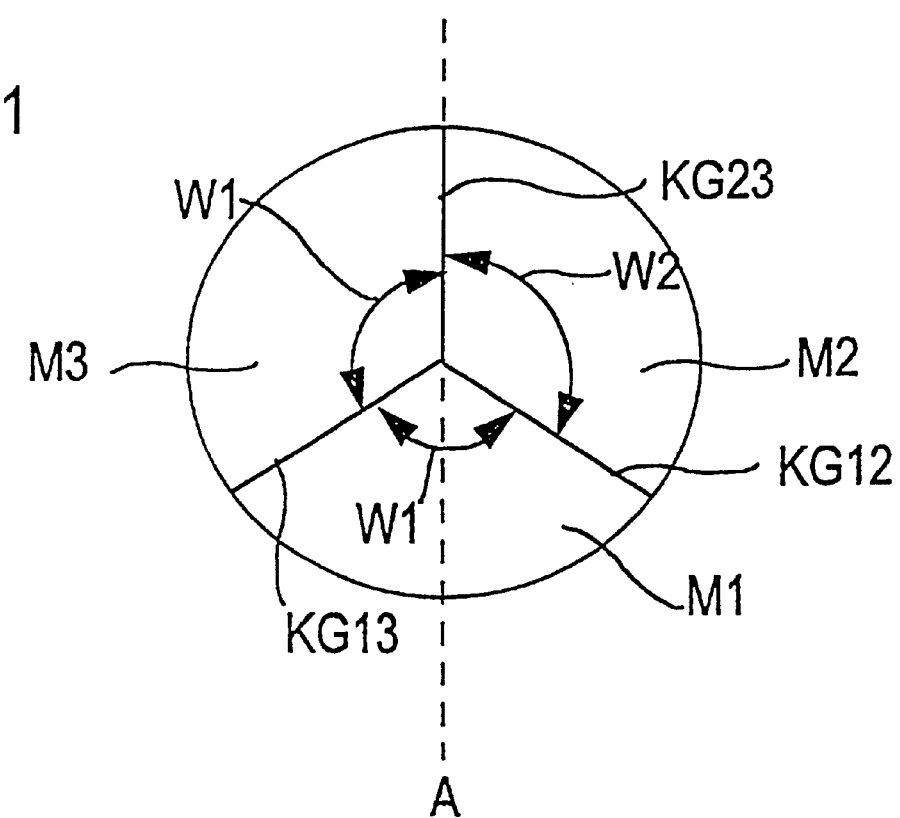
FIG. 11 shows a tricrystal wafer in horizontal projection.

FIG. 11 shows a tricrystal wafer which is preferably used as a substrate for the solar cell according to the invention. This wafer comprises three monocrystalline regions M1, M2 and M3 which are all (110) oriented, but tilted toward one another.

In the figure, the tricrystal wafer is disposed such that a first-order twin grain boundary KG12 having (111) planes as crystal faces that delimit the grain is produced between the monocrystalline regions M1 and M2. The grain boundary KG13 between M1 and M3 is also a first-order twin grain boundary with delimiting (111) crystal planes. An optimally grown tricrystal having the two first-order twin grain boundaries has ideal internal angles between the different monocrystalline regions which amount to exactly 109.47° for W1 and exactly 125.26° for W2 and W3. Internal angles which deviate therefrom also result in a stable tricrystal wafer which can be obtained by sawing it out of corresponding tricrystal rods, whereby reliable handling of the corresponding wafer is guaranteed down to wafer thicknesses of 30 $\mu$m without any increased risk of rupture. Wafer thicknesses that are preferred for a solar cell range for example from 60 to 150 $\mu$m.

FIG. 11 shows an exemplary embodiment for the configuration of first and second contact patterns on the rear side of a tricrystal wafer. In accordance with the orientation illustrated in FIG. 9, the two lower shanks of the "star" formed by the grain boundaries form first-order twin grain boundaries. The slots in the tricrystal wafer are preferably disposed such that their length l is aligned parallel to one of the first-order twin grain boundaries. The slots are preferably aligned parallel to that first-order twin grain boundary which is closest to the slot. Corresponding to the configuration of the tricrystal wafer depicted in FIG. 9, the slot pattern is aligned parallel to the grain boundary KG13 in a first wafer half on the left of the imaginary axis A, but aligned parallel to the grain boundary KG12 in the wafer half on the right of the axis A. The slots are preferably offset against one another so that slots arranged side by side in a row do not end up in one and the same (111) plane. They are preferably offset against one another by more than a whole slot width.

Figure 12:
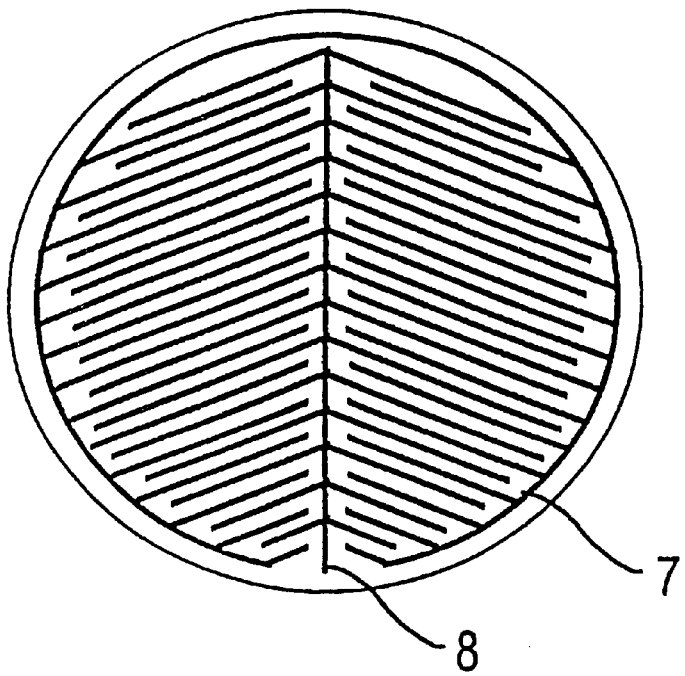
FIG. 12 shows a possible configuration for the first and second contact patterns on the rear side.

A second contact pattern 8 suitable therefor and overlapping all the slots is illustrated for example in FIG. 12. The first contact pattern 7 has a bus structure which is arranged circumferentially close to the substrate edge. Contact fingers emanating therefrom point at an angle to the substrate's central axis. The second contact pattern 8, on the other hand, has a central bus structure which is for example disposed parallel to the axis A shown in FIG. 9. The finger-like contacts emanating therefrom are disposed interdigital to the first contact structure 7 without touching same. The geometrical alignment of the first contact pattern 7 [should read: 7] is chosen in the exemplary embodiment such that the contact fingers are aligned parallel to the length l of the slots and they therefore overlap in terms of length. The first contact pattern 7 does not overlap any of the slots. But it is also possible to change around the assignment of the contact patterns to the p and n-doped areas of the solar cell so that for example the contact pattern with the circumferential bus structure overlaps the slots and therefore contacts the n-doped areas, whereas the contact pattern with the central bus structure serves to contact the p-doped bulk material.

The width of the finger-like contacts for the first and second contact patterns is set for example to about 300 $\mu$m. Such a contact pattern can be created reliably and reproducibly using conventional screen printing techniques. Much wider or narrower finger-like contacts are also possible, however. Corresponding to the gap between the slots, the finger-like contacts of a contact structure are spaced about 3 mm apart from one another.

One or more antireflection layers of a suitable thickness can then also be applied to the passivation layer 6, e.g. further oxide, nitride or titanium oxide layers.

A solar cell according to the invention produced in this manner meets all the prerequisites necessary for achieving collection efficiency of more than 20%. The demand that the diffusion length be greater for the minority charge carriers than the three-fold thickness of the silicon substrate is satisfied by the solar cell according to the invention with inexpensive CZ silicon in which the diffusion length L exceeds the substrate thickness d by 1.5 times (where d=60 $\mu$m, L≧120 $\mu$m). High surface quality, expressed by a low surface recombination velocity S, can be simply and reliably achieved by means of passivation layers on both the front and rear sides. High surface quality of S<1000 cm/s can be set over the emitter by means of oxide passivation. As regards the rear-side quality, a surface recombination velocity of S<100 cm/s is required, which can be achieved in the solar cell according to the invention even without further measures. Requisite shading losses of less than 4 percent are also exceeded by means of the solar cell according to the invention, since it exhibits virtually no shading. Low requisite reflection values of <4 percent are obtained by using standard antireflection layers. A high fill factor of at least 80 percent is also achieved by the invention.

Another advantage of solar cells with contacts applied only to the rear side is that it is easier to mechanically connect different solar cells to form a module, because no more lead-ins on the front side are necessary in order to solder corresponding connections on. This simplifies the connecting process and increases procedural reliability. The solar cells according to the invention are therefore fully automated and can be produced on an industrial scale.

What is claimed is:

1. A solar cell comprising:
    a crystalline silicon substrate exhibiting crystallographic (110) planes on a front side and a rear side;
    a flat doped emitter layer on at least the front side;
    a plurality of elongated slots aligned parallel to crystallographic (111) planes and extending through an entire thickness of the crystalline silicon substrate;
    a high doping, corresponding to a conductivity type of the flat doped emitter layer, in the elongated slots;
    a first contact pattern on the rear side for electrical connection of a bulk material; and
    a second contact pattern on the rear side for electrical connection of the emitter layer, the second contact pattern overlapping the elongated slots at least in part;

wherein the elongated slots are crystallographically etched anistopically from the rear side so that crystallographic (111) planes as delimiting surfaces are exposed in the elongated slots, the elongated slots tapering toward the front side of the solar cell with two walls extending at an angle to a surface of the solar cell.

2. A solar cell according to claim 1, wherein the crystalline silicon substrate comprises a tricrystal wafer having three monocrystalline, respectively (110)-oriented regions tilted toward one another, mutual boundary areas of the regions extending radially and forming sectors of the tricrystal wafer, and two of the boundary areas forming first-order twin grain boundaries on crystallographic (111) planes.

3. A solar cell according to claim 1, wherein the first and second contact patterns comprise imprinted thick-film contacts.

4. A solar cell according to claim 1, wherein the elongated slots are regularly distributed over the surface of the solar cell and have a width of 5 to 50 $\mu$m.

5. A solar cell according to claim 1, wherein the elongated slots extend parallel to crystallographic (111) planes, but are offset against one another.

6. A solar cell according to claim 1, wherein the first and second contact patterns comprise finger-like contacts which interdigitally engage with one another and at least one bus structure which respectively connects all the fingerlike contacts together, one of the bus structures arranged circumferentially on the outside proximate to an edge of the solar cell on the rear side.

7. A method of producing a solar cell comprising front-side contacts displaced to the rear side, comprising providing a (110)-oriented crystalline silicon substrate;

etching, from the rear side, in an alkaline, crystal-oriented and masked manner parallel to crystallographic (111) planes into the silicon substrate, a plurality of slots extending through an entire thickness of the silicon substrate;

producing by diffusion of a dopant a flat emitter layer; and producing on the rear side, by imprinting and burning-in a conductive paste, a first contact pattern and a second contact pattern, the second contact pattern being disposed to overlap the slots.

8. A method according to claim 7, wherein diffusion of the dopant takes place all over;

doping the emitter layer in the region of the first contact pattern is overcompensated by correspondingly doping the paste during the burning-in process; and the emitter layer on the rear side is separated between first and second contact patterns.

9. A method according to claim 7, wherein etching the plurality of slots is performed with a photolithographically structured etching mask made of nitride or oxide.

10. A method according to claim 7, wherein etching the plurality of slots is performed with controlled timing and completed just when an opening which extends through the silicon substrate has been produced.

11. A method according to claim 7, wherein the length of the plurality of slots is chosen in accordance with the thickness of the silicon substrate such that the virtual intersection of both crystallographic (111) planes which extend at an angle to a surface of the silicon substrate and delimit each slot is just outside the silicon substrate above the front side.

12. A method according to claim 7, wherein the emitter layer on the rear side is separated between the first and second contact patterns by means of masked etching, the first and second contact patterns being used as a mask.

* * * * *